US008378438B2

(12) United States Patent
Apalkov et al.

(10) Patent No.: US 8,378,438 B2
(45) Date of Patent: Feb. 19, 2013

(54) METHOD AND SYSTEM FOR PROVIDING MAGNETIC ELEMENTS HAVING ENHANCED MAGNETIC ANISOTROPY AND MEMORIES USING SUCH MAGNETIC ELEMENTS

(75) Inventors: Dmytro Apalkov, San Jose, CA (US); Yunfei Ding, Fremont, CA (US)

(73) Assignee: Grandis, Inc., San Jose, CA (US)

(*) Notice: Subject to any disclaimer, the term of this patent is extended or adjusted under 35 U.S.C. 154(b) by 469 days.

(21) Appl. No.: 12/328,255

(22) Filed: Dec. 4, 2008

(65) Prior Publication Data
US 2010/0140726 A1    Jun. 10, 2010

(51) Int. Cl.
  *H01L 29/82*    (2006.01)
(52) U.S. Cl. ............... 257/421; 257/E29.323; 365/158; 365/171; 438/3
(58) Field of Classification Search .................. 257/421, 257/E29.323; 365/158, 171; 438/3
See application file for complete search history.

(56) References Cited

U.S. PATENT DOCUMENTS 6,765,819 B1 * 7/2004 Bhattacharyya et al. ..... 365/158
7,285,836 B2 * 10/2007 Ju et al. ........................ 257/421

OTHER PUBLICATIONS

Yiming Huai, et al., Structure, Materials and Shape Optimization of Magnetic Tunnel Junction Devices: Spin-Transfer Switching Current Reduction for Future Magnetoresistive Random Access Memory Application, Japanese Journal of Applied Physics, vol. 45, No. 5A, 2006, pp. 1-7.

J.W. Harrell, Orientation Dependence of the Dynamic Coercivity of Stoner-Wohlfarth Particles, IEEE Transactions on Magnetics, vol. 37, No. 1, Jan. 2001, pp. 533-537.
D.V. Dimitrov, et al., Nucleation field in synthetic antiferromagnet stabilized with uniaxial or unidirectional anisotropy, Journal of Magnetism and Magnetic Materials 218, 2000, pp. 273-286.
A.E. Berkowitz and Kentaro Takano, Exchange anisotropy—a review, Journal of Magnetism and Magnetic Materials 200, 1999, pp. 552-570.
W.J. Gallagher and S.S.P. Parkin, Development of the magnetic tunnel junction MRAM at IBM: From first junctions to a 16-Mb MRAM demonstrator chip, IBM J. Res. & Dev., vol. 50, No. 1, Jan. 2006, pp. 5-23A.
M.T. Johnson, et al., Perpendicular magnetic anisotropy of multilayers: recent insights, Journal of Magnetism and Magnetic Materials 148, 1995, pp. 118-124.

* cited by examiner

*Primary Examiner* — Robert Huber
(74) *Attorney, Agent, or Firm* — Convergent Law Group LLP (57) ABSTRACT

A method and system for providing a magnetic element are described. The magnetic element includes pinned and free layers, a nonmagnetic spacer layer between the free and pinned layers, and a stability structure. The free layer is between the spacer layer and the stability structure. The free layer has a free layer magnetization, at least one free layer easy axis, and at least one hard axis. The stability structure includes magnetic layers and is configured to decrease a first magnetic energy corresponding to the free layer magnetization being aligned with the at least one easy axis without decreasing a second magnetic energy corresponding to the free layer magnetization being aligned with the at least one hard axis. The magnetic element is configured to allow the free layer magnetization to be switched to between states when a write current is passed through the magnetic element.

29 Claims, 6 Drawing Sheets

METHOD AND SYSTEM FOR PROVIDING MAGNETIC ELEMENTS HAVING ENHANCED MAGNETIC ANISOTROPY AND MEMORIES USING SUCH MAGNETIC ELEMENTS

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic elements written at least in part by a current driven through the magnetic element.

Figure 1:
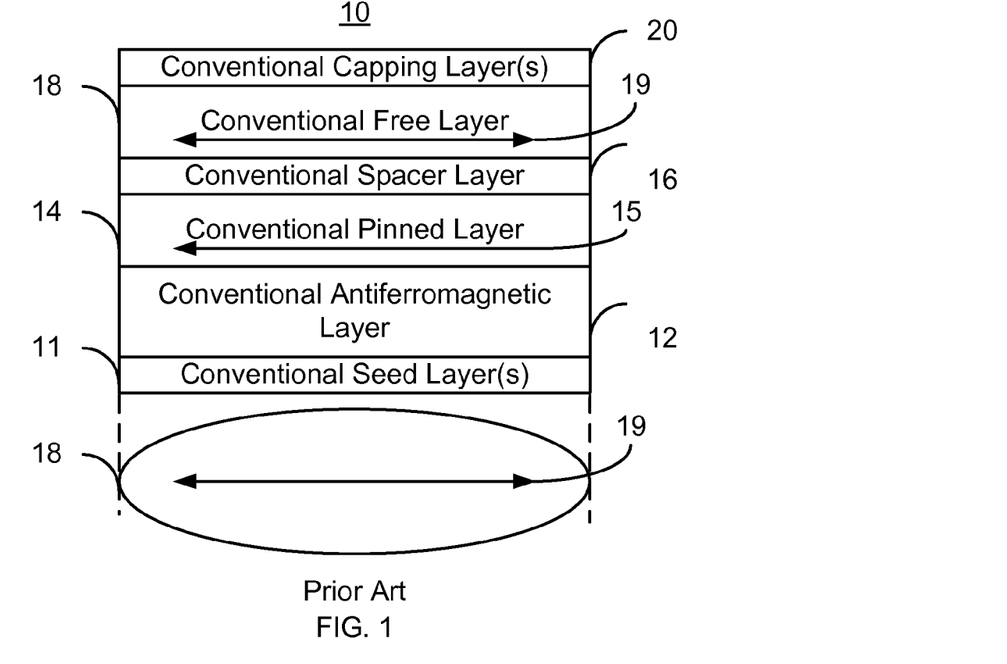
FIG. 1 depicts a conventional magnetic element.

For example, FIG. 1 depicts a conventional magnetic element 10, which may be a conventional magnetic tunneling junction (MTJ) or a conventional spin valve. The conventional magnetic element 10 may be used in a conventional magnetic memory, such as a conventional STT-RAM. In memory applications, the conventional magnetic element 10 is typically a conventional MTJ. The conventional MTJ typically resides on a substrate (not shown), uses conventional seed layer(s) 11 and includes a conventional antiferromagnetic (AFM) layer 12, a conventional pinned layer 14, a conventional barrier or spacer layer 16, a conventional free layer 18, and a conventional capping layer 20.

The spacer layer 16 is nonmagnetic. The spacer layer 16 may be a tunneling barrier layer, for example a thin insulator, or a conductor. The conventional capping layer 20 is typically used to provide protection for the underlying layers 11, 12, 14, 16, and 18. The conventional seed layer(s) 11 are typically utilized to aid in the growth of subsequent layers, such as the AFM layer 12, having a desired crystal structure.

The conventional pinned layer 14 and the conventional free layer 18 are magnetic. The magnetization 15 of the conventional pinned layer 14 is fixed, or pinned, in a particular direction, typically by an exchange-bias interaction with the AFM layer 12. Although depicted as a simple (single) layer, the conventional pinned layer 14 may include multiple layers. For example, the conventional pinned layer 14 may be a synthetic layer including magnetic layers antiferromagnetically or ferromagnetically coupled through thin conductive layers, such as Ru. In such a synthetic layer, multiple magnetic layers interleaved with a thin layer of Ru may be used. Further, other versions of the conventional magnetic element 10 might include an additional pinned layer (not shown) separated from the free layer 18 by an additional nonmagnetic barrier or conductive layer (not shown).

The conventional free layer 18 has a changeable magnetization 19. Although depicted as a simple layer, the conventional free layer 18 may also include multiple layers. For example, the conventional free layer 18 may be a synthetic layer including magnetic layers antiferromagnetically or ferromagnetically coupled through thin conductive layers, such as Ru.

The conventional magnetic element 10 may use spin transfer torque to write to the conventional magnetic element 10. In particularly, spin transfer torque rotates the magnetization 19 of the conventional free layer 18 to one of the two directions along its easy axis. When a write current is passed through the conventional magnetic element 10 perpendicular to the plane of the layers, electrons may be spin polarized by the conventional pinned layer 14. The spin transfer torque on the magnetization 19 of the conventional free layer 18 may be given by: $T \sim I*M_{FL}*M_{PL}*\sin(\theta)$, where $\theta$ is the angle between the magnetization 19 of the free layer 18 and the pinned layer magnetization 15 with large enough current to generate adequate torque to switch the conventional free layer 18. With a sufficient current, the conventional free layer 10 may be written to the desired state.

Applications for the conventional magnetic element 10 such as STT-RAM require the conventional magnetic element 10 to be thermally stable. Stated differently, the conventional magnetic element 10 has sufficient thermal stability that the magnetization 19 of the conventional free layer 18 is not be switched by thermal fluctuations. In order for this to occur, the conventional free layer 18 has a magnetic anisotropy energy sufficient to retain the magnetization 19 in the direction it was written. If the magnetic anisotropy energy is too small the magnetization can be rotated to other directions by random thermal fluctuations, and the stored information is lost.

The magnetic anisotropy energy of a magnetic element with a uniaxial magnetic anisotropy can be given by:

$$E_b = K_u V \quad (1)$$

where $K_u$ is the magnetic anisotropy constant and V is the volume of the element. The thermal stability factor of such a magnetic element is defined as:

$$\Delta = \frac{K_u V}{k_B T} \quad (2)$$

where $k_B$ is Boltzman constant and T is temperature. The $k_B T$ is the energy of thermal fluctuations. To prevent the conventional magnetic element 10 from being switched by thermal fluctuations within a given period of time, $\Delta$ has to be larger than a particular value set by design considerations. For example, to keep the magnetization 19 in the switched state for ten years, $\Delta$ is above approximately forty.

When the conventional magnetic element 10 has dimensions in the deep sub-micron scale, the volume V of the element is very small. To have a large enough $\Delta$, therefore, the anisotropy constant $K_u$ is very large. Factors such as intrinsic or crystalline anisotropy and shape anisotropy contribute to the anisotropy constant. Thus, these properties are tailored to obtain the desired $\Delta$, as well as other magnetic characteristics of the conventional magnetic element 10. Many conventional magnetic devices typically use materials with fairly small intrinsic magnetic anisotropy constant to obtain desired magnetic properties. Consequently, a common method of increasing $K_u$ is to pattern the conventional magnetic element 10, particularly the conventional free layer 18, into elongated shapes. Such shapes introduce a shape magnetic anisotropy. Such a shape is depicted in FIG. 1. The easy axis of the conventional free layer 18 lies along the long axis of the ellipse into which the conventional magnetic element 10 has been patterned. Thus, the magnetization 19 of the conventional free layer 18 may remain stable in the direction shown in FIG. 1.

Figure 2:
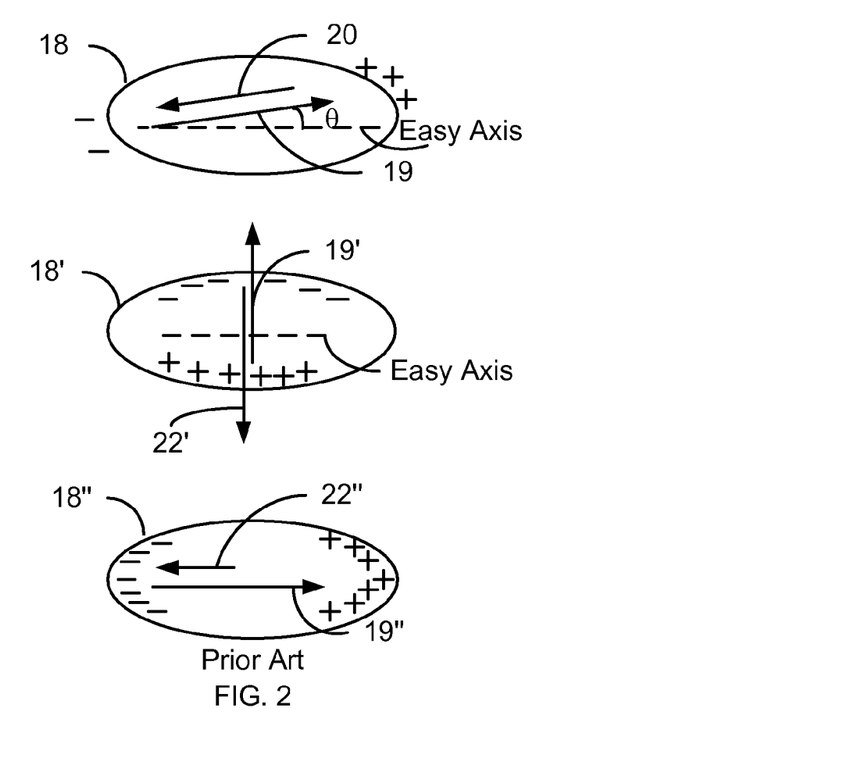
FIG. 2 depicts the shape of the conventional magnetic element under various conditions

FIG. 2 depicts the shape of the conventional magnetic element 10 under various conditions. Stability of the magnetization 19 of the conventional free layer 18 due to shape anisotropy may be explained with reference to FIG. 2. As discussed above, the majority of the anisotropy of the conventional free layer 18 comes from its shape anisotropy. When the magnetization 19 of the element points to a certain direction, for example at an angle $\theta$ from the long axis of the ellipse (the easy axis), positive and negative magnetic charges are produced at the edges of the ellipse by the magnetization. The magnetic charges induce a demagnetizing magnetic field 20 pointing substantially opposite to the magnetization 19. The magnetostatic energy density caused by this field is:

$$E_s = -M \cdot H \quad (3)$$

Where M and H are vectors. As a result, the magnetostatic energy density due to the shape of the conventional magnetic element 10 is:

$$E_s = K_s \sin^2 \theta \quad (4)$$

where $K_s$ is the shape induced uniaxial anisotropy constant. If the magnetization 19' is perpendicular to the easy axis, the magnetostatic energy of the cell is largest. As can be seen in the free layer 18' of FIG. 2, this occurs because the positive and negative magnetic charges are closer together and the demagnetizing field 22 is highest. When the magnetization 19" is aligned with the long, or easy, axis, the charges on the surface are farther apart. Thus, the demagnetizing field 22" is smaller and the magnetostatic energy is smallest. This can be seen in the free layer 18" of FIG. 2. The energy barrier height between the two easy directions ($\theta=0°$ and $180°$) then equals to $K_s V$—the energy difference between high-energy state (magnetization 19' along the short axis) and low-energy state (magnetization 19" along the long axis). Thus, the shape anisotropy may provide thermal stability.

Although utilizing a shape anisotropy may provide thermal stability, this approach has drawbacks. In particular, photolithography is typically used to define the shape of the conventional magnetic element 10. Conventional techniques make defining the shape of the conventional magnetic element difficult. Further, as the density of STT-RAM memories increase and the size of the conventional magnetic element 10 decreases, this conventional approach becomes increasingly difficult.

Accordingly, what is needed is a method and system that may improve the thermal stability of the spin transfer torque based memories. The method and system address such a need.

BRIEF SUMMARY OF THE INVENTION

A method and system for providing a magnetic element and memory utilizing the magnetic element are described. The magnetic element includes pinned and free layers, a nonmagnetic spacer layer between the free and pinned layers, and a stability structure. The free layer is between the spacer layer and the stability structure. The free layer has a free layer magnetization, at least one free layer easy axis, and at least one hard axis. The stability structure includes magnetic layers and is configured to decrease a first magnetic energy of a first configuration corresponding to the free layer magnetization being aligned with the at least one easy axis without increasing a second magnetic energy of a second configuration corresponding to the free layer magnetization being aligned with the at least one hard axis. The magnetic element is configured to allow the free layer magnetization to be switched to each of a plurality of states when a write current is passed through the magnetic element.

According to the method and system disclosed herein, a magnetic memory that may have improved thermal stability may be achieved.

DETAILED DESCRIPTION OF THE INVENTION

The method and system relate to magnetic memories. The following description is presented to enable one of ordinary skill in the art to make and use the method and system and is provided in the context of a patent application and its requirements. Various modifications to the embodiments and the generic principles and features described herein will be readily apparent to those skilled in the art. Thus, the method and system are not intended to be limited to the embodiments shown, but is to be accorded the widest scope consistent with the principles and features described herein.

A method and system for providing a magnetic element and memory utilizing the magnetic element are described. The magnetic element includes pinned and free layers, a nonmagnetic spacer layer between the free and pinned layers, and a stability structure. The free layer is between the spacer layer and the stability structure. The free layer has a free layer magnetization, at least one free layer easy axis, and at least one hard axis. The stability structure includes magnetic layers and is configured to decrease a first magnetic energy of a first configuration corresponding to the free layer magnetization being aligned with the at least one easy axis without increasing a second magnetic energy of a second configuration corresponding to the free layer magnetization being aligned with the at least one hard axis. The magnetic element is configured to allow the free layer magnetization to be switched to each of a plurality of states when a write current is passed through the magnetic element.

The method and system are described in the context of particular magnetic elements and magnetic memories having certain components. One of ordinary skill in the art will readily recognize that the present invention is consistent with the use of magnetic elements and magnetic memories having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. For example, the pinned layer is depicted on the bottom of a magnetic element. In other embodiments, the pinned layer might be at the top of the magnetic element. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements.

Figure 3:
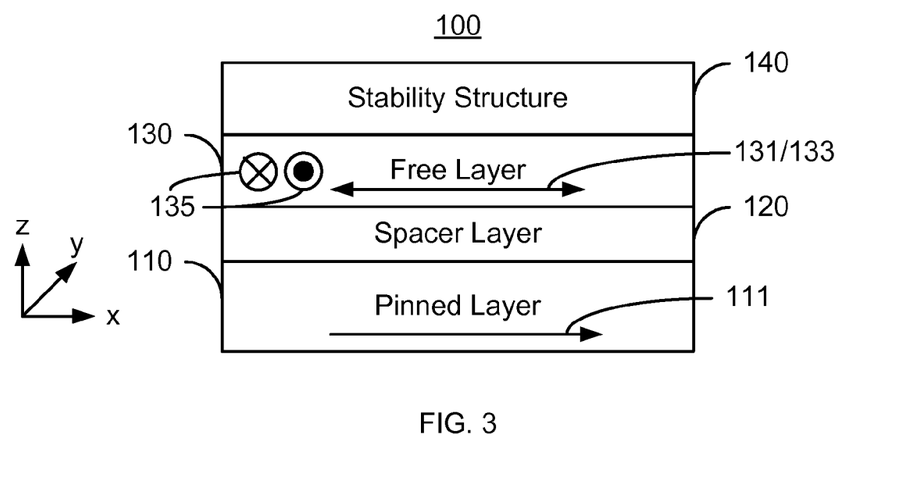
FIG. 3 depicts an exemplary of a magnetic element having improved thermal stability.

FIG. 3 depicts an exemplary of a magnetic element 100 having improved thermal stability. For clarity, FIG. 3 is not drawn to scale and some portions of the magnetic element 100 might be omitted. The magnetic element 100 includes a pinned layer 110, a spacer layer 120, free layer 130, and stability structure 140. The magnetic element 100 may also include seed layer(s) (not shown), capping layer(s) (not shown). In addition, the magnetic element 100 generally also includes a pinning structure, such as an AFM layer (not shown), which is used to fix, or pin, the magnetization of the pinned layer 110 in a desired direction.

The spacer layer 120 is nonmagnetic and may be a conductor or an insulator, for example forming a tunneling barrier. In alternate embodiments, the spacer layer 120 might have another structure, for example a granular layer including conductive channels in an insulating matrix. Examples of materials that might be used for the spacer layer 120 include materials such as MgO, TiO, and Cu.

The pinned layer 110 and the free layer 130 are magnetic and thus may include one or more of Ni, Fe, and Co, particularly in an alloy form. The magnetization 111 of the pinned layer 110 is fixed, or pinned, in a particular direction, typically by an exchange-bias interaction with an AFM layer (not shown). Although depicted as a simple layer, the pinned layer 110 may include multiple layers. For example, the pinned layer 110 may be a synthetic layer including magnetic layers antiferromagnetically or ferromagnetically coupled through thin conductive layers, such as Ru. In such a synthetic layer, multiple magnetic layers interleaved with a thin layer of Ru may be used.

The free layer 130 has a changeable magnetization 131. Although depicted as a simple layer, the free layer 130 may also include multiple layers. For example, the free layer 130 may be a synthetic layer including magnetic layers antiferromagnetically or ferromagnetically coupled through thin conductive layers, such as Ru. In addition, the free layer has an easy axis 133. In the embodiment shown, the easy axis 133 is depicted as the same as the magnetization 131 because the magnetization 131 has an equilibrium position along the easy axis 133. In the embodiment shown, the easy axis 133 is in the plane of the free layer 130. The free layer 130 also has a hard axis 135 which, in the embodiment shown, is perpendicular to the easy axis 133. The hard axis 135 is perpendicular to the plane of the page in FIG. 3 (along the y-direction). In one embodiment, the free layer 130 also has a hard axis (not shown) perpendicular to the plane of the free layer. Such a direction would be up or down as shown in FIG. 3 (along the z-direction). The magnetic element 100 is also configured to allow the free layer 130 to be switched to each of a plurality of states when a write current is passed through the magnetic element 100. Thus, spin transfer torque may be used to switch the magnetization 131 of the free layer 130 to be parallel or antiparallel to the magnetization 111 of the pinned layer 110.

The stability structure 140 includes a plurality of magnetic layers, which are not shown in FIG. 3. The stability structure 140 is configured to decrease the first magnetic energy of the magnetic element 100 for a first configuration. The first configuration occurs if the free layer magnetization 131 is aligned with the easy axis 133 and, therefore, parallel or antiparallel to the magnetization 111 of the pinned layer 110. The first configuration corresponds to the equilibrium state of the magnetic element 100. The magnetic energies of the equilibrium states of the free layer magnetization 131 are thus decreased. The stability structure 140 decreases the first magnetic energy without increasing a second magnetic energy of a second configuration. The second configuration occurs if the free layer magnetization 131 is aligned with the hard axis 135. Note that although the stability structure 140 is considered to leave the second magnetic energy unaffected, one of ordinary skill in the art will recognize that in some embodiments, there may be a slight change in the second magnetic energy. However, the energy barrier between the first and second magnetic energies is increased substantially without increasing the barrier to switching utilizing spin transfer torque.

Because the first magnetic energy of the equilibrium state(s) of the free layer 130 have a lower energy while the second energy remains substantially unchanged, the magnetic element 100 has improved thermal stability. The barrier to thermal fluctuations corresponds to the difference between the first and second magnetic energies. This energy difference is what would have to be overcome by thermal energy to allow the free layer magnetization 131 to rotate out of one equilibrium position to a new equilibrium position. Thus, the barrier to thermal fluctuations may be increased. As a result, the magnetic element 100 is less subject to thermal fluctuations and thermal stability may be increased. The magnetic element 100 may thus be more suitable for applications such as STT-RAM.

Figure 4:
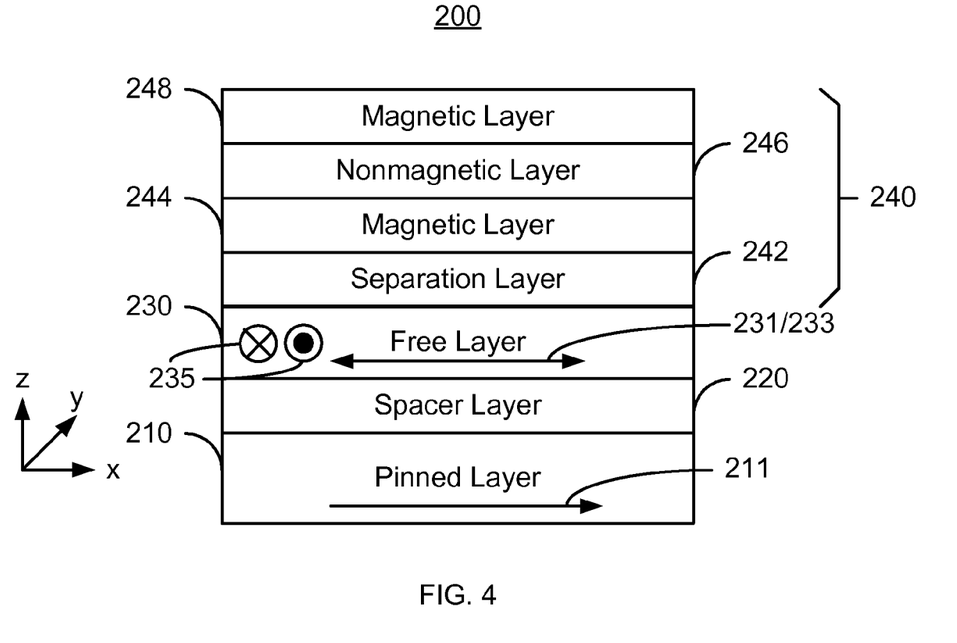
FIG. 4 depicts another exemplary embodiment of a magnetic element having improved thermal stability.

FIG. 4 depicts another exemplary embodiment of a magnetic element 200 having improved thermal stability. For clarity, FIG. 4 is not drawn to scale and some portions of the magnetic element 200 might be omitted. In addition, the magnetic element 200 is analogous to the magnetic element 100 of FIG. 3. Consequently, analogous structures have similar labels. The magnetic element 200 includes a pinned layer 210, a spacer layer 220, a free layer 230, and a stability structure 240 corresponding to the pinned layer 110, the spacer layer 120, the free layer 130, and the stability structure 140, respectively. Similarly, the magnetization 211 of the pinned layer 210, the magnetization 231 of the free layer 230, the easy axis 233 of the free layer 230, and the hard axis 235 of the free layer 230 correspond to the magnetization 111 of the pinned layer 110, the magnetization 131 of the free layer 130, the easy axis 133 of the free layer 130, and the hard axis 135 of the free layer 130, respectively. The magnetic element 200 may also include seed layer(s) (not shown), capping layer(s) (not shown). In addition, the magnetic element 200 generally also include a pinning structure, such as an AFM layer (not shown), which is used to fix, or pin, the magnetization 211 of the pinned layer 210 in a desired direction. The layers 210, 220, 230, and 240 of the magnetic element 200 have similar functions to and may be made of similar materials as the layers 110, 120, 130, and 140, respectively.

The spacer layer 220 is nonmagnetic and may be a conductor or an insulator, for example forming a tunneling barrier. In an alternate embodiment, the spacer layer 220 might have another structure, for example a granular layer including conductive channels in an insulating matrix. The pinned layer 210 and the free layer 230 are magnetic. Although depicted as simple layers, the pinned layer 210 and/or the free layer 230 may include multiple layers. For example, the pinned layer 210 and/or the free layer 230 may be a synthetic layer including magnetic layers antiferromagnetically or ferromagnetically coupled through thin conductive layers, such as Ru. In such a synthetic layer, multiple magnetic layers interleaved with a thin layer of Ru may be used.

The free layer 230 has a changeable magnetization 231. In addition, the free layer has an easy axis 233. In the embodiment shown, the easy axis 233 is depicted as the same as the magnetization 231 because the magnetization 231 has an equilibrium position along the easy axis 233. In the embodiment shown, the easy axis 233 is in the plane of the free layer 230. In the embodiment shown, the hard axis 235 of the free layer 230 is perpendicular to the easy axis 133 and perpendicular to the plane of the page in FIG. 4 (along the y-direction). In one embodiment, the free layer 130 also has a hard axis (not shown) perpendicular to the plane of the free layer. Such a direction would be up or down as shown in FIG. 4 (along the z-direction). The magnetic element 200 is also configured to allow the free layer 230 to be switched to each of a plurality of states when a write current is passed through the magnetic element 200. Thus, spin transfer torque may be used to switch the magnetization 231 of the free layer 230 to be parallel or antiparallel to the magnetization 211 of the pinned layer 210.

The stability structure 240 includes a nonmagnetic separation layer 242, magnetic layers 244 and 248 and nonmagnetic layer 246. The separation layer 242 and nonmagnetic layer 246 may include materials such as Ru. The separation layer 242 may also include conductive metals such as Ta and Cu or thin insulators such as aluminum oxide MgO. The separation layer 242 is used to ensure that the magnetic layer 244 is not directly exchange coupled with the free layer 230. Thus, for example, the separation layer 242 may be 0.5 to 5 nm thick.

The magnetizations of the magnetic layers 244 and 248 are not shown in FIG. 4. However, the magnetic layers 244 and 248 are antiferromagnetically coupled through the nonmagnetic layer 246. The nonmagnetic layer 246 may have a thickness configured to ensure that the magnetic layers 244 and 248 are antiferromagnetically coupled. The nonmagnetic layer 246 may include materials such as Ru. In the embodiment shown, the magnetic layers 244 and 248 have a uniaxial anisotropy. A uniaxial anisotropy aids in preventing the magnetizations (not shown in FIG. 4) of the magnetic layers 244 and 248 from forming a scissor state (described below) due to a magnetostatic field from the free layer 230 when the free layer magnetization 231 is aligned with the hard axis 235. However, the uniaxial anisotropy is desired to be small so that the magnetizations (not shown in FIG. 4) of the magnetic layers 244 and 248 can form a scissor state when the free layer magnetization 231 is aligned with the easy axis 233.

The stability structure 240 is configured to decrease the first magnetic energy of a first configuration in which the free layer magnetization 231 is aligned with the easy axis 233. The first configuration corresponds to the equilibrium state of the magnetic element 200. The magnetic energies of the equilibrium states of the magnetic element 200 are thus decreased. The stability structure 240 decreases the first magnetic energy without decreasing a second magnetic energy of a second configuration in which the free layer magnetization 231 is aligned with the hard axis 235. Note that although the stability structure 240 is considered to leave the second magnetic energy unaffected, one of ordinary skill in the art will recognize that in some embodiments, there may be a slight change in the second magnetic energy. However, the energy barrier between the first and second magnetic energies is increased substantially without increasing the barrier to switching utilizing spin transfer torque.

Figure 5:
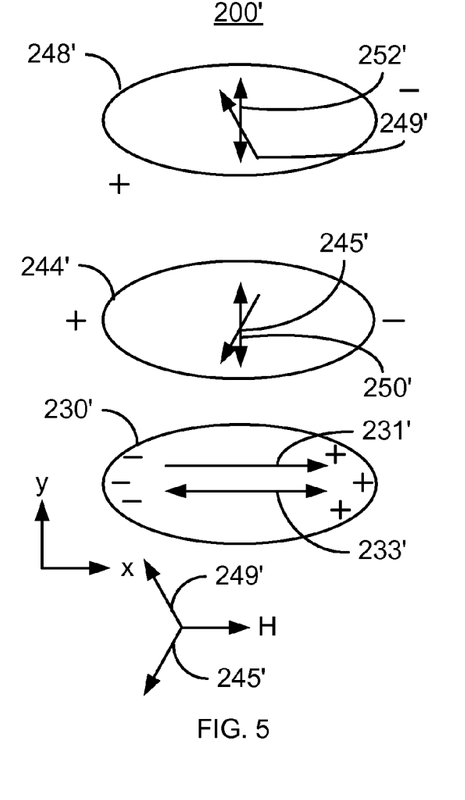
FIGS. 5-6 depict an exemplary embodiment of a portion of the magnetic element having improved stability in various configurations.
Figure 6:
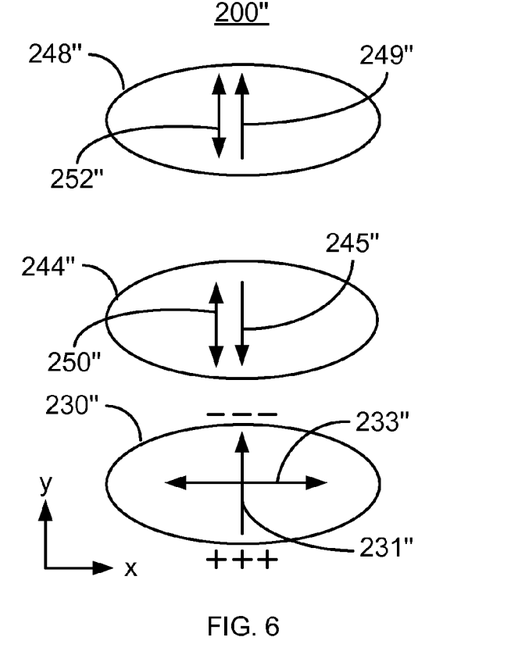

To more particularly describe the operation of the stability structure, refer to FIGS. 5-6, which depict an exemplary embodiment of a portion of the magnetic element 200 having improved stability in two configurations. In particular, FIG. 5 depicts a first configuration in which the free layer magnetization lies along the easy axis. In contrast, FIG. 6 depicts the second configuration, in which the free layer magnetization lies along the hard axis. Although the +x and +y directions are shown in FIGS. 5-6, the same analysis holds for the −x and −y directions. Because specific configurations are shown, the magnetic element 200 is depicted as being 200' and 200" in FIGS. 5 and 6, respectively. For clarity, the layers 230'/230", 244'/244", and 248'/248" are separately depicted.

Referring to FIGS. 4-6, in the embodiment shown, the magnetic layers 244'/244" and 248'/248" have the uniaxial anisotropy described above and magnetizations 245'/245" and 249'/249", respectively. The easy axes 250'/250" and 252'/252" of the magnetic layers 244'/244" and 248'/248", respectively, are perpendicular to the easy axis 233'/233" of the free layer 230'/230". The magnetizations 245'/245" and 249'/249" are also antiferromagnetically coupled through the nonmagnetic layer 244 (not shown in FIGS. 5-6). In the embodiment shown, the magnetic layers 244'/244" and 248'/248" are patterned into the same oval shape and the same size as the free layer 230'/230". However, in another embodiment, the magnetic layers 244'/244" and 248'/248" need not have the same size or shape as the free layer 230'/230". Similarly, the free layer 230'/230" and/or the magnetic layers 244'/244" and 248'/248" may have a shape other than the oval shown. However, in such an embodiment, the free layer 230'/230" still has the easy axis 233'/233".

When there is no external magnetic field applied to the magnetic layers 244'/244' and 248"/248", the magnetizations 245'/245" and 249'/249" respectively, would lie along the easy axis 250'/250" and 252'/252". Because they are antiferromagnetically coupled, the magnetizations 245'/245" and 249'/249" would also be opposite in direction. However, when the free layer magnetization 231" lies along the easy axis 233'/233", a field is generated on the magnetic layers 244' and 248', changing their magnetization directions. For example, the magnetization 231' of the free layer 230' may lie in the +x direction, as shown in FIG. 5. As a result, the magnetization 245' and 249' of the magnetic layers 244' and 248', respectively, are in a scissor state. In the scissor state, the magnetization 245' and 249' of each layer deviates slightly from the easy axis 250' and 252', respectively, in a direction opposite to the free layer magnetization 231'. Thus, as shown in FIG. 5, the magnetizations 245' and 249' deviate from vertical toward the −x direction. This rearrangement of the magnetizations 245' and 249' of the magnetic layers 244' and 248' of the stability structure 240 produces a magnetic field on the free layer 230' in the same direction as the free layer magnetization 231'. This magnetic field decreases the total magnetic energy for the free layer 230' and thus the magnetic element 200.

In contrast to this, FIG. 6 depicts the second configuration in which the free layer magnetization 231" is along the hard axis 235 (not shown in FIG. 6) in the y direction. As a result, the magnetizations 245" and 249" remain along the easy axes 250" and 252", respectively. In addition, the magnetizations 245" and 249" are antiparallel because the nucleation field along the easy axis of two antiferromagnetically-coupled layers is much higher than it is along the hard axis of the SAF structure. As a result, the total magnetic field experienced by the free layer 230" due to the magnetic layers 244" and 248" is close to zero. In some embodiments, for example in which the structure 200/200'/200" has been optimized, the magnetic field is zero. Consequently, the presence of the stability structure 240 decreases the energy of the free layer magnetization 231/231'/231" when it is along the easy axis 233/233'/233" substantially without any change in the energy of the free layer magnetization 231'/231'/231" when it is along the hard axis 235. Stated differently, the stability structure 240 may decrease the magnetic energy of the first configuration without increasing the magnetic energy of the second configuration. This increases the energy barrier between the two configurations. Consequently, thermal stability of the magnetic element 200/200'/200" is improved. As a result, the magnetic element 200 is less subject to thermal fluctuations and may thus be more suitable for applications such as STT-RAM.

In addition to improving the thermal stability of the magnetic element 200, the stability structure 240 may improve the spin transfer switching of the magnetic element 200. The magnetic layers 244 and 248, the separation layer 242 and the free layer 230 may be considered to form a spin valve or magnetic tunneling junction (MTJ) structure with a metal spacer or an insulating tunnel barrier, depending upon the separation layer 242. When a current is driven in perpendicular-to-plane direction through magnetic element 200, and thus the spin valve/MTJ formed by the layers 230, 242, 244 and 248, electrons are polarized by the magnetic layers 244 and 248. These electrons can exert a spin transfer torque on the magnetic layers, including the free layer 230. This spin transfer torque from the stability structure 240 is in addition to the spin transfer torque from the remainder of the magnetic element 200. The additional spin transfer torque generated by the magnetic layer 244 does not favor either of the two equilibrium states because the magnetization of the magnetic layer 244 is substantially perpendicular to both directions. However at the initial stage of the switching process the magnetic layer 244 generates a large spin transfer torque on the free layer 230 that can rotate the free layer magnetization 231 from its original direction. This may increase the spin transfer torque generated by the pinned layer 210. Thus, use of the stability structure 240 including magnetic layer 244 may also decrease the critical switching current and increase the switching speed.

Figure 7:
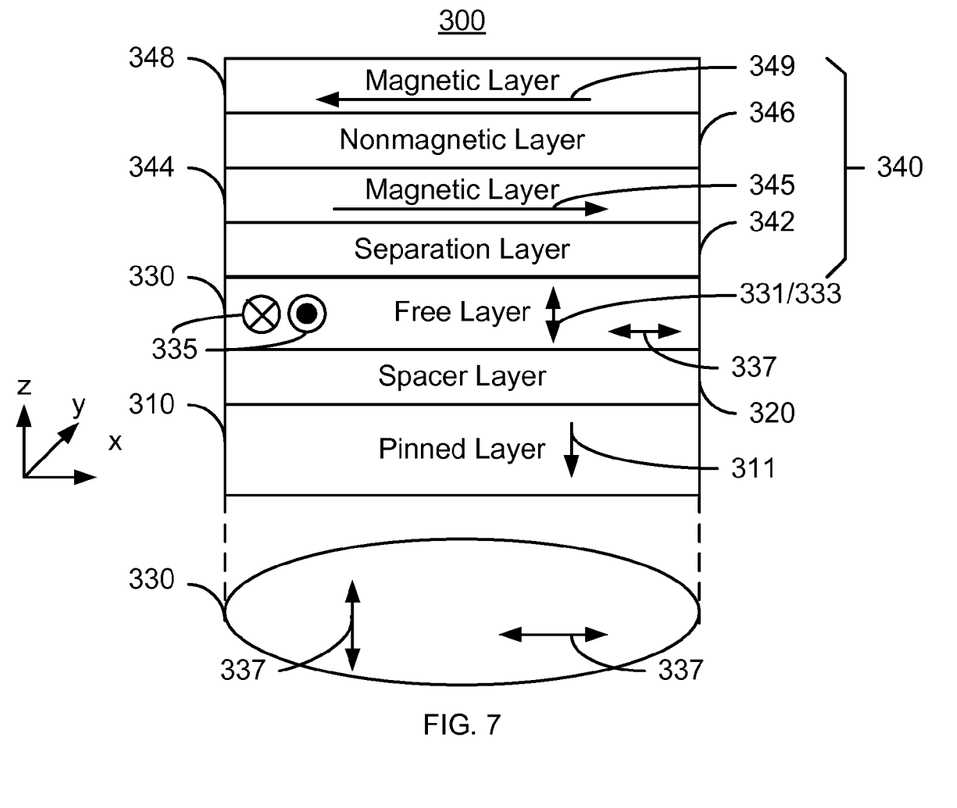
FIG. 7 depicts another exemplary embodiment of a magnetic element having improved thermal stability.

FIG. 7 depicts another exemplary embodiment of a magnetic element 300 having improved thermal stability. For clarity, FIG. 7 is not drawn to scale and some portions of the magnetic element 300 might be omitted. In addition, the magnetic element 300 is analogous to the magnetic elements 100 and 200 of FIGS. 3 and 4, respectively. Consequently, analogous structures have similar labels. The magnetic element 300 includes a pinned layer 310, a spacer layer 320, a free layer 330, and a stability structure 340 corresponding to the pinned layer 110/210, the spacer layer 120/220, the free layer 130/230, and the stability structure 140/240, respectively. Similarly, the magnetization 311 of the pinned layer 310, the magnetization 331 of the free layer 330, the easy axis 333 of the free layer 330, and the hard axis 335 of the free layer 330 correspond to the magnetization 111/211 of the pinned layer 110/210, the magnetization 131/231 of the free layer 130/230, the easy axis 133/233 of the free layer 130/230, and the hard axis 135/235 of the free layer 130/230, respectively. Further, the separation layer 342, the magnetic layers 344 and 348, and the spacer layer 346 of the stability structure 340 correspond to the separation layer 242, the magnetic layers 244 and 248, and the spacer layer 246, respectively, of the stability structure 240. The magnetizations 345 and 349 of the magnetic layers 344 and 348, respectively, correspond to the magnetizations 245'/245" and 249'/249" of the magnetic layers 244/244'/244" and 248/248'/248", respectively. The magnetic element 300 may also includes seed layer(s) (not shown), capping layer(s) (not shown). In addition, the magnetic element 200 generally also includes a pinning structure, such as an AFM layer (not shown), which is used to fix, or pin, the magnetization 311 of the pinned layer 310 in a desired direction. The layers 310, 320, 330, and 340 of the magnetic element 300 have similar functions to and may be made of similar materials as the layers 110/210, 120/220, 130/230, and 140/240, respectively.

As can be seen in FIG. 7, the free layer magnetization 331 and easy axis 333 are perpendicular to the plane of the free layer (in the z-direction in FIG. 7). Thus, the free layer 330 has an out-of-plane anisotropy that is greater than an in-plane anisotropy. This may be achieved through an intrinsic anisotropy and/or a surface anisotropy. Such a surface anisotropy may be achieved through a combination of several layers, such as repetitions of Co/Pd bilayers, Co/Pt bilayers, or other similar layers. Such bilayers may provide a surface anisotropy between two or more materials of the free layer 330 that produces out-of-plane anisotropy. In addition to having out-of-plane anisotropy, the magnetization of the free layer 330 has an in-plane hard axis 335 (along the y axis) and an in-plane easy axis 337 along x axis. The in-plane easy axis 337 is, however, not a lowest energy equilibrium state. Stated differently, the easy axis 337 may actually be considered a hard axis that is intermediate between the easy axis 333 and the hard axis 335. Thus, the path of lowest energy between two equilibrium magnetization states of the magnetization 331 (parallel and antiparallel to the +z direction) involves magnetization 331 passing through the x-axis.

In addition, the easy axes and thus magnetizations 345 and 349 of the magnetic layers 344 and 348, respectively, are in-plane. This might be achieved by through intrinsic anisotropy of the material(s) used for the layers 344 and 348 and/or a shape anisotropy obtained by elongating the layers 344 and 348 in the along x axis.

The magnetic element 300, particularly the stability structure 340, operates in a similar manner to the magnetic elements 100 and 200. In the first configuration, the magnetization 331 lies along its out-of-plane easy axis 333, in the +z or −z direction. In such a configuration, the magnetizations 345 and 349 tilt to form scissor state. In this scissor state, the magnetizations 345 and 349 have a nonzero total out-of-plane component. This out-of-plane component imposes a magnetic field on the free layer 330 in the same direction as the free layer magnetization 331, lowering the energy of this configuration.

If the free layer magnetization 331 is being switched to the other equilibrium state, the lowest energy path of the magnetization 331 is through +x or −x direction. When the magnetization 331 is along the x-axis, the field exerted by the free layer magnetization 331 on the magnetizations 345 and 349 is substantially along easy axes of these magnetic layers 344 and 348, respectively. Thus, the magnetizations 345 and 349 do not form the scissor state. Thus, the total magnetic field from the magnetic layers 344 and 348 on the free layer 330 is close to or at zero. Thus, the energy barrier between the two equilibrium states of the free layer magnetization 331 is enhanced. Thermal stability of the magnetic element 300 is thereby improved. Further, as discussed above, the magnetic element 300 may have reduced spin transfer switching current and increased switching speed.

Figure 8:
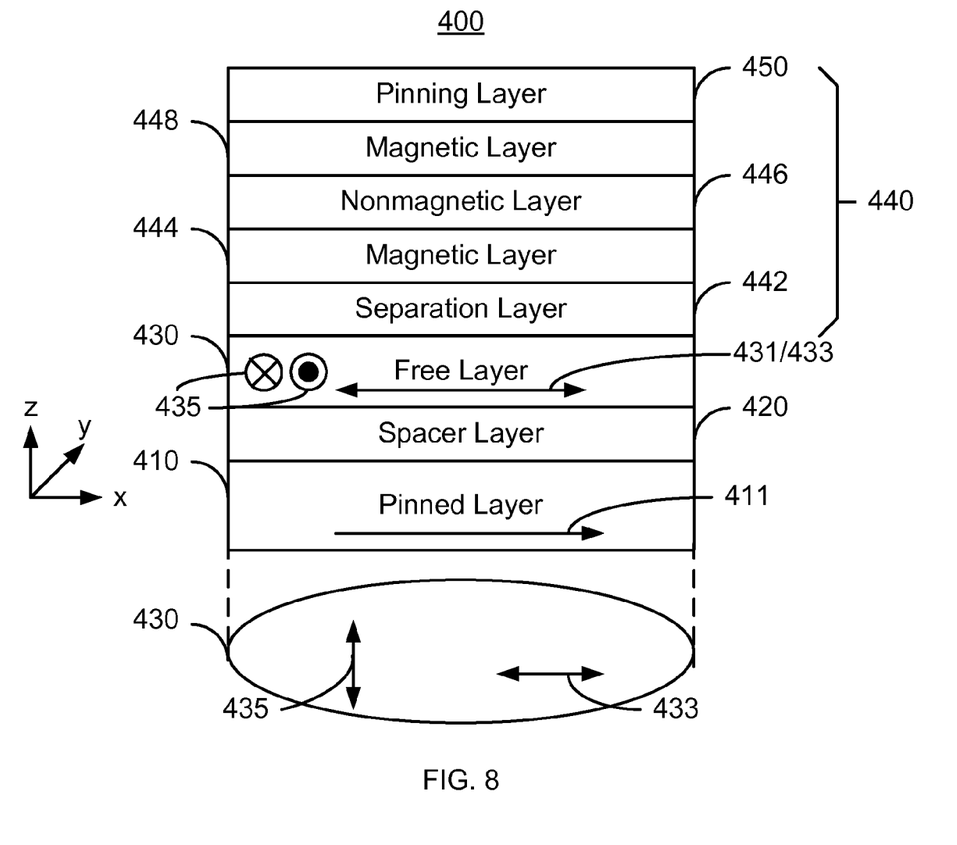
FIG. 8 depicts another exemplary embodiment of a magnetic element having improved thermal stability.

FIG. 8 depicts another exemplary embodiment of a magnetic element 400 having improved thermal stability. For clarity, FIG. 8 is not drawn to scale and some portions of the magnetic element 400 might be omitted. In addition, the magnetic element 400 is analogous to the magnetic elements 100 and 200 of FIGS. 3 and 4, respectively. Consequently, analogous structures have similar labels. The magnetic element 400 includes a pinned layer 410, a spacer layer 420, a free layer 430, and a stability structure 440 corresponding to the pinned layer 110/210, the spacer layer 120/220, the free layer 130/230, and the stability structure 140/240, respectively. Similarly, the magnetization 411 of the pinned layer 410, the magnetization 431 of the free layer 430, the easy axis 433 of the free layer 430, and the hard axis 435 of the free layer 430 correspond to the magnetization 111/211 of the pinned layer 110/210, the magnetization 131/231 of the free layer 130/230, the easy axis 133/233 of the free layer 130/230, and the hard axis 135/235 of the free layer 130/230, respectively. Further, the separation layer 442, the magnetic layers 444 and 448, and the spacer layer 446 of the stability structure 440 correspond to the separation layer 242, the magnetic layers 244 and 248, and the spacer layer 246, respectively, of the stability structure 240. The magnetic element 400 may also includes seed layer(s) (not shown), capping layer(s) (not shown). In addition, the magnetic element 400 generally also includes a pinning structure, such as an AFM layer (not shown), which is used to fix, or pin, the magnetization 411 of the pinned layer 410 in a desired direction. The layers 410, 420, 430, and 440 of the magnetic element 300 have similar functions to and may be made of similar materials as the layers 110/210, 120/220, 130/230, and 140/240, respectively.

As can be seen in FIG. 8, the stability structure 440 includes a pinning layer 450. The pinning layer 450 may be an AFM layer that tends to pin the magnetization of the magnetic layer 448 in a direction perpendicular to the easy axis 433 of the free layer 430. The pinning layer 450 aids in preventing the magnetizations (not shown in FIG. 8) of the magnetic layers 444 and 448 do not rotate to a scissor state when the free layer magnetization 431 is aligned with the hard axis 435. However, the anisotropy due to the pinning layer 450 is desired to be small so that the magnetizations (not shown in FIG. 8) of the magnetic layers 444 and 448 can form a scissor state when the free layer magnetization 431 is aligned with the easy axis 433.

The magnetic element 400, particularly the stability structure 440, operates in a similar manner to the magnetic elements 100, 200, and 300. In the first configuration, the magnetization 431 lies along its easy axis 433, in the +x or −x direction. In such a configuration, the magnetizations of 445 and 449 tilt to form scissor state. In this scissor state, the magnetizations 445 and 449 have a nonzero total component opposite to the direction of the free layer magnetization 431. This component imposes a magnetic field on the free layer 430 in the same direction as the free layer magnetization 431, lowering the energy of this configuration. If the free layer magnetization 431 is along the hard axis 435, the magnetizations 445 and 449 do not form the scissor state. Thus, the total magnetic field from the magnetic layers 444 and 448 on the free layer 430 is close to or at zero. Thus, the energy barrier between the two equilibrium states of the free layer magnetization 431 is enhanced. Thermal stability of the magnetic element 400 is thereby improved. Further, for the reasons discussed above, the magnetic element 400 may have reduced spin transfer switching current and increased switching speed.

Figure 9:
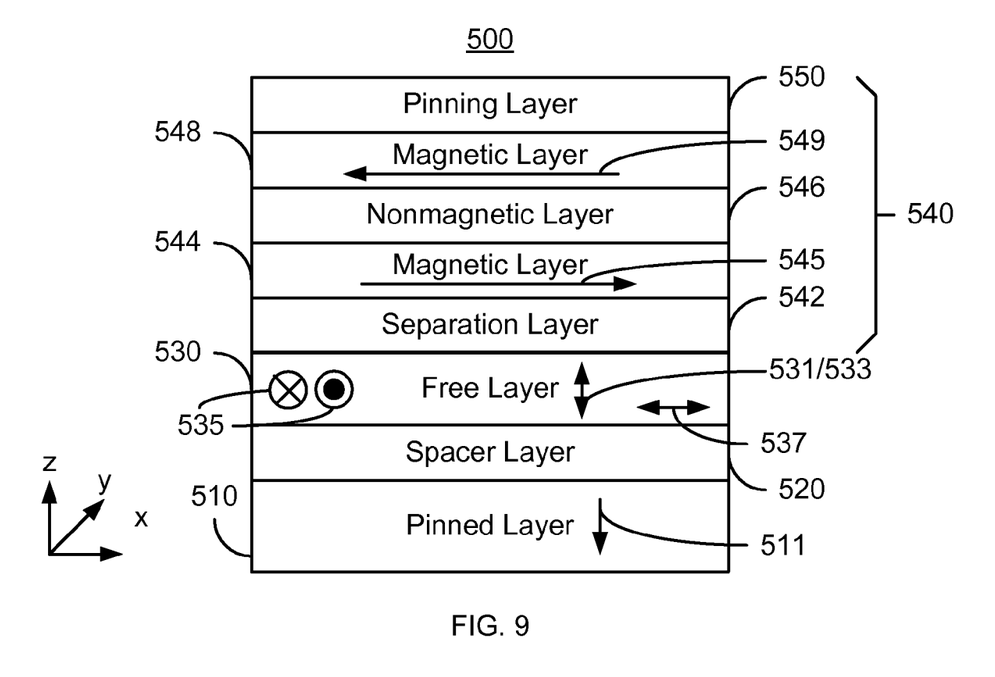
FIG. 9 depicts another exemplary embodiment of a magnetic element having improved thermal stability.

FIG. 9 depicts another exemplary embodiment of a magnetic element 500 having improved thermal stability—with another pinning layer and perpendicular. For clarity, FIG. 9 is not drawn to scale and some portions of the magnetic element 500 might be omitted. In addition, the magnetic element 500 is analogous to the magnetic elements 100, 200, 300, and 400 of FIGS. 3, 4, 7, and 8, respectively. Consequently, analogous structures have similar labels. The magnetic element 500 includes a pinned layer 510, a spacer layer 520, a free layer 530, and a stability structure 540 corresponding to the pinned layer 110/210/310/410, the spacer layer 120/220/320/420, the free layer 130/230/330/430, and the stability structure 140/240/340/440, respectively. Similarly, the magnetization 511 of the pinned layer 510, the magnetization 531 of the free layer 530, the easy axis 533 of the free layer 530, the hard axis 535, and the additional easy axis 537 of the free layer 530 correspond to the magnetization 111/211/311/411 of the pinned layer 110/210/310/410, the magnetization 131/231/331/431 of the free layer 130/230/330/430, the easy axis 133/233/333/433 of the free layer 130/230/330/430, the additional easy axis 337, and the hard axis 135/235/335/435 of the free layer 130/230/330/430, respectively. Further, the separation layer 542, the magnetic layers 544 and 548, and the spacer layer 546 of the stability structure 540 correspond to the separation layer 242/342/442, the magnetic layers 244/344/444 and 248/348/448, and the spacer layer 246/346/446, respectively, of the stability structure 240/340/440. The magnetic element 500 may also includes seed layer(s) (not shown), capping layer(s) (not shown). In addition, the magnetic element 500 generally also includes a pinning structure, such as an AFM layer (not shown), which is used to fix, or pin, the magnetization 511 of the pinned layer 510 in a desired direction. The layers 510, 520, 530, and 540 of the magnetic element 500 have similar functions to and may be made of similar materials as the layers 110/210/310/410, 120/220/320/420, 130/230/330/430, and 140/240/340/440, respectively.

As can be seen in FIG. 9, the stability structure 540 includes a pinning layer 550 in the stability structure 540. The pinning layer 550 may be an AFM layer that tends to pin the magnetization of the magnetic layer 548 in a direction perpendicular to the easy axis 533 of the free layer 530. The pinning layer 550 aids in preventing the magnetizations (not shown in FIG. 9) of the magnetic layers 544 and 548 do not rotate to a scissor state when the free layer magnetization 531 is aligned with the hard axis 535. However, the anisotropy due to the pinning layer 550 is desired to be small so that the magnetizations (not shown in FIG. 8) of the magnetic layers 544 and 548 can form a scissor state when the free layer magnetization 531 is aligned with the easy axis 533.

In addition, the free layer magnetization 531 and easy axis 533 are perpendicular to the plane of the free layer (in the z-direction in FIG. 9). Thus, the free layer 530 has an out-of-plane anisotropy that is greater than an in-plane anisotropy. This may be achieved through an intrinsic anisotropy and/or a surface anisotropy. Such a surface anisotropy may be achieved through a combination of several layers, such as repetitions of Co/Pd bilayers, Co/Pt bilayers, or other similar layers. Such bilayers may provide a surface anisotropy between two or more materials of the free layer 530 that produces out-of-plane anisotropy. In addition to having out-of-plane anisotropy, the magnetization of the free layer 530 has an in-plane hard axis 535 (along the y axis) and an in-plane easy axis 537 along x axis. The in-plane easy axis 537 is, however, not a lowest energy equilibrium state. Stated differently, the easy axis 537 may actually be considered a hard axis that is intermediate between the easy axis 533 and the hard axis 535. Thus, the path of lowest energy between two equilibrium magnetization states of the magnetization 531 (parallel and antiparallel to the +z direction) involves magnetization 531 passing through the x-axis.

The magnetic element 500, particularly the stability structure 540, operates in a similar manner to the magnetic elements 100, 200, 300, and 400. In the first configuration, the magnetization 531 lies along its easy axis 533, in the +z or −z direction. In such a configuration, the magnetizations of 545 and 549 tilt to form scissor state. In this scissor state, the magnetizations 545 and 549 have a nonzero total component opposite to the direction of the free layer magnetization 531. This component imposes a magnetic field on the free layer 530 in the same direction as the free layer magnetization 531, lowering the energy of this configuration. If the free layer magnetization 531 is along the easy axis 537 as the magnetization 531 transitions between the +z and −z directions, the magnetizations 545 and 549 do not form the scissor state. Thus, the total magnetic field from the magnetic layers 544 and 548 on the free layer 530 is close to or at zero. Thus, the energy barrier between the two equilibrium states of the free layer magnetization 531 is enhanced. Thermal stability of the magnetic element 500 is thereby improved. Further, for the reasons discussed above, the magnetic element 500 may have reduced spin transfer switching current and increased switching speed.

Figure 10:
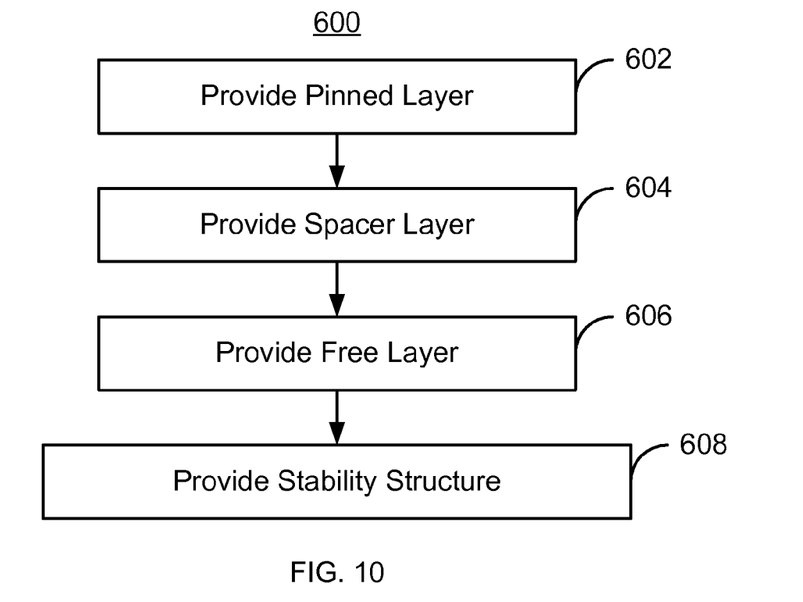
FIG. 10 depicts an exemplary embodiment of a method for fabricating magnetic element having improved thermal stability.

FIG. 10 depicts an exemplary embodiment of a method 600 for fabricating magnetic element having improved thermal stability. The method 600 is described in the context of the magnetic element 100. However, the method 600 may be used for other magnetic elements including but not limited to the magnetic elements 200, 300, 400, and 500. A pinned layer 110 is provided, via step 602. The spacer layer 120 is provided, via step 604. The free layer 130 is provided, via step 606. In one embodiment, step 606 includes depositing and patterning at least the free layer 130 to have the desired shape anisotropy. The free layer 130 thus has a free layer magnetization 131, a free layer easy axis 133, and at least one hard axis 135.

The method 600 also includes providing a stability structure, via step 608. In some embodiments, step 608 includes a plurality of magnetic layers. In addition, step 608 may also include providing a separation layer and nonmagnetic layer(s) interleaved with the magnetic layers. Step 608 also includes configuring the stability structure such that a first magnetic energy of a first configuration corresponding to the free layer magnetization being aligned with the at least one easy axis is decreased without increasing a second magnetic energy of a second configuration corresponding to the free layer magnetization being aligned with the at least one hard axis. Further, the magnetic element 100 is configured to allow the free layer magnetization to be switched to each of a plurality of states when a write current is passed through the magnetic element.

Using the method 600, the magnetic element 100, 200, 300, 400, and/or 500 may be fabricated. Consequently, the benefits of the magnetic element may be achieved.

A method and system for providing a magnetic memory element and memory fabricated using the magnetic memory element has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic element comprising:
a pinned layer, the pinned layer being magnetic and having at least one pinned layer magnetic moment;
a spacer layer, the spacer layer being nonmagnetic;
a free layer having a free layer magnetization, at least one free layer easy axis, and at least one hard axis, the spacer layer residing between the pinned layer and the free layer, the at least one pinned layer magnetic moment being aligned substantially parallel to the at least one easy axis; and
a stability structure including a plurality of magnetic layers, the free layer residing between the spacer layer and the stability structure, the stability structure being configured to decrease a first magnetic energy of a first configuration with respect to a stability structure-free magnetic energy without decreasing a second magnetic energy of a second configuration, the first configuration corresponding to the free layer magnetization being aligned with the at least one easy axis, the second configuration corresponding to the free layer magnetization being aligned with the at least one hard axis, the stability structure-free magnetic energy corresponding to the first configuration for the magnetic element including the free layer, the pinned layer, and the spacer layer and not including the stability structure, wherein the stability structure is free of magnetic pinning layers adjoining the plurality of magnetic layers;
wherein the magnetic element is configured to allow the free layer magnetization to be switched to each of a plurality of states when a write current is passed through the magnetic element.

2. The magnetic element of claim 1 wherein each of the plurality of magnetic layers has an easy axis and a magnetization antiferromagnetically coupled with the magnetization of a next magnetic layer of the plurality of magnetic layers, the easy axis being substantially perpendicular to the at least one free layer easy axis.

3. The magnetic element of claim 2 wherein the stability structure further includes:
at least one nonmagnetic layer, the plurality of magnetic layers being interleaved with the at least one nonmagnetic layer.

4. The magnetic element of claim 3 wherein the at least one nonmagnetic layer has a thickness, the thickness being configured such that the plurality of magnetic layers are antiferromagnetically coupled.

5. The magnetic element of claim 1 wherein the stability structure further includes:
a separation layer between the free layer and a closest magnetic layer of the plurality of magnetic layers, the separation layer being nonmagnetic.

6. The magnetic element of claim 1 wherein the stability structure further includes a pinning layer coupled with one of the plurality of magnetic layers.

7. The magnetic element of claim 6 wherein the pinning layer further includes an antiferromagnetic layer.

8. The magnetic element of claim 1 wherein the at least one easy axis is perpendicular to a free layer plane.

9. The magnetic element of claim 1 wherein the at least one easy axis lies in a free layer plane.

10. The magnetic element of claim 1 wherein the free layer is a synthetic free layer including at least a first magnetic layer, a second magnetic layer, and a nonmagnetic spacer layer between the first magnetic layer and the second magnetic layer.

11. The magnetic element of claim 1 wherein the spacer layer is an insulating barrier layer.

12. The magnetic element of claim 1 wherein the pinned layer is a synthetic pinned layer including at least a first magnetic layer, a second magnetic layer, and a nonmagnetic spacer layer between the first magnetic layer and the second magnetic layer.

13. A magnetic element comprising:
a pinned layer, the pinned layer being magnetic and having a pinned layer magnetization;
a spacer layer, the spacer layer being nonmagnetic;
a free layer having a free layer magnetization, at least one free layer easy axis, and at least one hard axis, the spacer layer residing between the pinned layer and the free layer, the pinned layer magnetization being aligned in a direction substantially parallel to the at least one free layer easy axis;
a stability structure including a separation layer, a plurality of magnetic layers and at least one nonmagnetic spacer layer, the separation layer being nonmagnetic and residing between the plurality of magnetic layers and the free layer, the plurality of magnetic layers being interleaved with the at least one nonmagnetic spacer layer, each of the plurality of magnetic layers having an easy axis and a magnetization antiferromagnetically coupled with the magnetization of a next magnetic layer of the plurality of magnetic layers, the easy axis being substantially perpendicular to the at least one free layer easy axis, the plurality of magnetic layers being in a scissor state when the free layer magnetization is aligned with the at least one easy axis, wherein the stability structure is free of magnetic pinning layers adjoining the plurality of magnetic layers;
wherein the magnetic element is configured to allow the free layer magnetization to be switched to each of a plurality of states when a write current is passed through the magnetic element.

14. A magnetic memory comprising:
a plurality of magnetic storage cells, each of the plurality of magnetic storage cells including at least one magnetic element, each of the at least one magnetic element including a pinned layer having at least one pinned layer magnetic moment, a free layer, a spacer layer between the pinned layer and the free layer, and a stability structure, the free layer being between the spacer layer and the stability structure, the spacer layer being nonmagnetic, the free layer having a free layer magnetization, at least one free layer easy axis, and at least one hard axis, the spacer layer residing between the pinned layer and the free layer, the at least one pinned layer magnetic moment being pinned substantially parallel to the at least one free layer easy axis, the stability structure including a plurality of magnetic layers, the stability structure being configured to decrease a first magnetic energy of a first configuration with respect to a stability structure-free magnetic energy, and substantially without decreasing a second magnetic energy of a second configuration, the first configuration corresponding to the free layer magnetization being aligned with the at least one easy axis, the second configuration corresponding to the free layer magnetization being aligned with the at least one hard axis, the stability structure-free magnetic energy corresponding to the first configuration for the magnetic element including the free layer, the pinned layer, and the spacer layer and not including the stability structure, the magnetic element is configured to allow the free layer magnetization to be switched to each of a plurality of states when a write current is passed through the magnetic element, wherein the stability structure is free of magnetic pinning layers adjoining the plurality of magnetic layers;
a plurality of word lines coupled with the plurality of magnetic storage cells; and
a plurality of bit lines coupled with the plurality of magnetic storage cells.

15. The magnetic memory of claim 14 wherein each of the plurality of magnetic layers has an easy axis and a magnetization antiferromagnetically coupled with the magnetization of a next magnetic layer of the plurality of magnetic layers, the easy axis being substantially perpendicular to the at least one free layer easy axis.

16. The magnetic memory of claim 15 wherein the stability structure further includes:
at least one nonmagnetic layer, the plurality of magnetic layers being interleaved with the at least one nonmagnetic layer.

17. The magnetic memory of claim 16 wherein the at least one nonmagnetic layer has a thickness, the thickness being configured such that the plurality of magnetic layers are antiferromagnetically coupled.

18. The magnetic memory of claim 14 wherein the stability structure further includes a pinning layer coupled with one of the plurality of magnetic layers.

19. The magnetic memory of claim 18 wherein the pinning layer further includes an antiferromagnetic layer.

20. The magnetic memory of claim 14 wherein the stability structure further includes:
a separation layer residing between the free layer and a closest magnetic layer of the plurality of magnetic layers, the separation layer being nonmagnetic.

21. The magnetic memory of claim 14 wherein the at least one easy axis is perpendicular to a free layer plane.

22. The magnetic memory of claim 14 wherein the at least one easy axis lies in a free layer plane.

23. The magnetic memory of claim 14 wherein the free layer is a synthetic free layer including at least a first magnetic layer, a second magnetic layer, and a nonmagnetic spacer layer between the first magnetic layer and the second magnetic layer.

24. The magnetic memory of claim 14 wherein the spacer layer is an insulating barrier layer.

25. The magnetic memory of claim 14 wherein the pinned layer is a synthetic pinned layer including at least a first magnetic layer, a second magnetic layer, and a nonmagnetic spacer layer between the first magnetic layer and the second magnetic layer.

26. A method for fabricating magnetic element comprising:
providing a pinned layer, the pinned layer being magnetic and having at least one pinned layer magnetization;
providing a spacer layer, the spacer layer being nonmagnetic;
providing a free layer having a free layer magnetization, at least one free layer easy axis, and at least one hard axis, the spacer layer residing between the pinned layer and the free layer, the at least one pinned layer magnetization being aligned substantially parallel to the at least one free layer easy axis; and
providing a stability structure including a plurality of magnetic layers, the free layer residing between the spacer layer and the stability structure, the stability structure being configured to decrease a first magnetic energy of a first configuration with respect to a stability structure-free magnetic energy and substantially without decreasing a second magnetic energy of a second configuration, the first configuration corresponding to the free layer magnetization being aligned with the at least one easy axis, the second configuration corresponding to the free layer magnetization being aligned with the at least one hard axis, the stability structure-free magnetic energy corresponding to the first configuration for the magnetic element including the free layer, the pinned layer, and the spacer layer and not including the stability structure, wherein the stability structure is free of magnetic pinning layers adjoining the plurality of magnetic layers;

wherein the magnetic element is configured to allow the free layer magnetization to be switched to each of a plurality of states when a write current is passed through the magnetic element.

27. The magnetic element of claim 1 wherein the plurality of magnetic layers have a plurality of magnetic moments, the plurality of magnetic moments being configured to be in a scissor state when the free layer magnetization is aligned with the at least one easy axis and each of the plurality of magnetic moments being configured to be antiparallel to at least one nearest magnetic moment of the plurality of magnetic moments when the free layer magnetization is aligned with the at least one hard axis.

28. The magnetic memory of claim 14 wherein the plurality of magnetic layers have a plurality of magnetic moments, the plurality of magnetic moments being configured to be in a scissor state when the free layer magnetization is aligned with the at least one easy axis and each of the plurality of magnetic moments being configured to be antiparallel to at least one nearest magnetic moment of the plurality of magnetic moments when the free layer magnetization is aligned with the at least one hard axis.

29. The method of claim 26 wherein the plurality of magnetic layers have a plurality of magnetic moments, the plurality of magnetic moments being configured to be in a scissor state when the free layer magnetization is aligned with the at least one easy axis and each of the plurality of magnetic moments being configured to be antiparallel to at least one nearest magnetic moment of the plurality of magnetic moments when the free layer magnetization is aligned with the at least one hard axis.

* * * * *